(12) United States Patent
Zhang et al.

(10) Patent No.: US 11,808,930 B2
(45) Date of Patent: Nov. 7, 2023

(54) OPTICAL OBJECTIVE LENS

(71) Applicant: ASML Netherlands B.V., Veldhoven (NL)

(72) Inventors: Jian Zhang, San Jose, CA (US); Zhiwen Kang, San Jose, CA (US); Yixiang Wang, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 821 days.

(21) Appl. No.: 16/650,862

(22) PCT Filed: Sep. 25, 2018

(86) PCT No.: PCT/EP2018/075926
§ 371 (c)(1),
(2) Date: Mar. 25, 2020

(87) PCT Pub. No.: WO2019/063528
PCT Pub. Date: Apr. 4, 2019

(65) Prior Publication Data
US 2020/0278524 A1 Sep. 3, 2020

Related U.S. Application Data

(60) Provisional application No. 62/564,983, filed on Sep. 28, 2017.

(51) Int. Cl.
*G02B 21/02* (2006.01)
*G02B 9/00* (2006.01)
(Continued)

(52) U.S. Cl.
CPC ............... *G02B 21/02* (2013.01); *G02B 9/00* (2013.01); *G02B 13/18* (2013.01); *G09B 9/10* (2013.01);
(Continued)

(58) Field of Classification Search
CPC .......... G02B 21/02; G02B 9/00; G02B 13/18; G09B 9/10; H01J 37/226; H01J 37/28;
(Continued)

(56) References Cited

U.S. PATENT DOCUMENTS 4,826,301 A * 5/1989 Ikemori ................. G02B 13/20
359/740
6,795,248 B2 * 9/2004 Kimura ............... G11B 7/13922
359/569

(Continued)

FOREIGN PATENT DOCUMENTS

| CN | 103257436 B | 8/2013 |
|---|---|---|
| EP | 2 584 391 A1 | 4/2013 |
| JP | 6063513 A1 | 4/1985 |

OTHER PUBLICATIONS

International Search Report and Written Opinion issued in related PCT International Application No. PCT/EP2018/075926, dated Jan. 3, 2019 (8 pgs.).

*Primary Examiner* — David A Vanore
(74) *Attorney, Agent, or Firm* — FINNEGAN, HENDERSON, FARABOW, GARRETT & DUNNER, LLP

(57) ABSTRACT

An objective lens for forming an image of an object. The objective lens includes, sequentially from an image side to an object side, a first lens group having negative refractive power, and a second lens group having positive refractive power.

15 Claims, 4 Drawing Sheets

(51) Int. Cl.
  *G02B 13/18* (2006.01)
  *H01J 37/22* (2006.01)
  *H01J 37/28* (2006.01)
  *G09B 9/10* (2006.01)
  *G01N 23/2251* (2018.01)

(52) U.S. Cl.
  CPC ............ *H01J 37/226* (2013.01); *H01J 37/28* (2013.01); *G01N 23/2251* (2013.01); *H01J 2237/26* (2013.01); *H01J 2237/2802* (2013.01)

(58) Field of Classification Search
  CPC ........... H01J 2237/26; H01J 2237/2802; H01J 2237/2817; G01N 23/2251
  See application file for complete search history.

(56) References Cited

U.S. PATENT DOCUMENTS

| | | | | |
|---|---|---|---|---|
| 6,865,025 | B2* | 3/2005 | Kimura | ................ G11B 7/1353 |
| | | | | 359/566 |
| 2003/0053218 | A1* | 3/2003 | Fujimoto | ............... G02B 21/02 |
| | | | | 359/661 |
| 2006/0238614 | A1* | 10/2006 | Konno | ............... A61B 1/00179 |
| | | | | 348/69 |
| 2009/0259098 | A1* | 10/2009 | Krattiger | ............ G02B 23/2415 |
| | | | | 600/109 |
| 2019/0237296 | A1* | 8/2019 | Otani | ......................... G06T 7/60 |
| 2020/0064600 | A1* | 2/2020 | Igarashi | ............... A61B 1/0002 |

* cited by examiner

OPTICAL OBJECTIVE LENS

CROSS-REFERENCE TO RELATED APPLICATIONS

This application is a national stage filing under 35 U.S.C. § 371 of International Application No. PCT/EP2018/075926, filed on Sep. 25, 2018, and published as WO 2019/063528 A1, which claims priority of U.S. Provisional Application No. 62/564,983, which was filed on Sep. 28, 2017, all of which are incorporated herein by reference in their entireties.

TECHNICAL FIELD

The present disclosure generally relates to an optical objective lens assembly used in a charged particle beam inspection system.

BACKGROUND

A charged particle beam based microscope, such as a scanning electron microscope (SEM) or a transmission electron microscope (TEM), is capable of providing image resolution down to less than a nanometer, and thus serves as a practicable tool for inspecting samples having a feature size that is sub-100 nanometers. The charged-particle-beam based microscope focuses and scans a beam of charged particles on a sample and detects secondary particles reflected from the sample. An optical imaging system is usually included in the charged-particle beam-based microscope to allow visual inspection of a sample.

SUMMARY

According to some embodiments of the disclosure, an objective lens for forming an image of an object is provided. The objective lens includes, sequentially from an image side to an object side, a first lens group having negative refractive power, and a second lens group having positive refractive power.

According to some embodiments of the disclosure, an optical imaging system used in a charged particle beam inspection system is provided. The optical imaging system includes: an illumination module configured to project a first light beam to an object; an objective lens configured to receive a second light beam reflected from the object and form an image of the object; and a detection module configured to detect the image of the sample. The objective lens includes, sequentially from an image side to an object side, a first lens group having negative refractive power and a second lens group having positive refractive power.

BRIEF DESCRIPTION OF THE DRAWINGS

The accompanying drawings, which are incorporated in and constitute a part of this specification, illustrate several embodiments.

DETAILED DESCRIPTION

Reference will now be made in detail to the example embodiments, which are illustrated in the accompanying drawings. Although the following embodiments are described in the context of utilizing electron beams, the disclosure is not so limited. Other types of charged particle beams can be similarly applied.

The disclosed embodiments provide an objective lens to be used in an optical imaging system in a charged particle beam inspection system. The objective lens includes, sequentially from an image side to an object side, a first lens group having negative refractive power, and a second lens group having positive refractive power. An effective focus length (EFL) of some embodiments of the first lens group ranges from −51 mm to −35 mm, and an EFL of some embodiments of the second lens group ranges from 26 mm to 30 mm. The objective lens described herein provides a longer working distance and a larger field of view.

Figure 1:
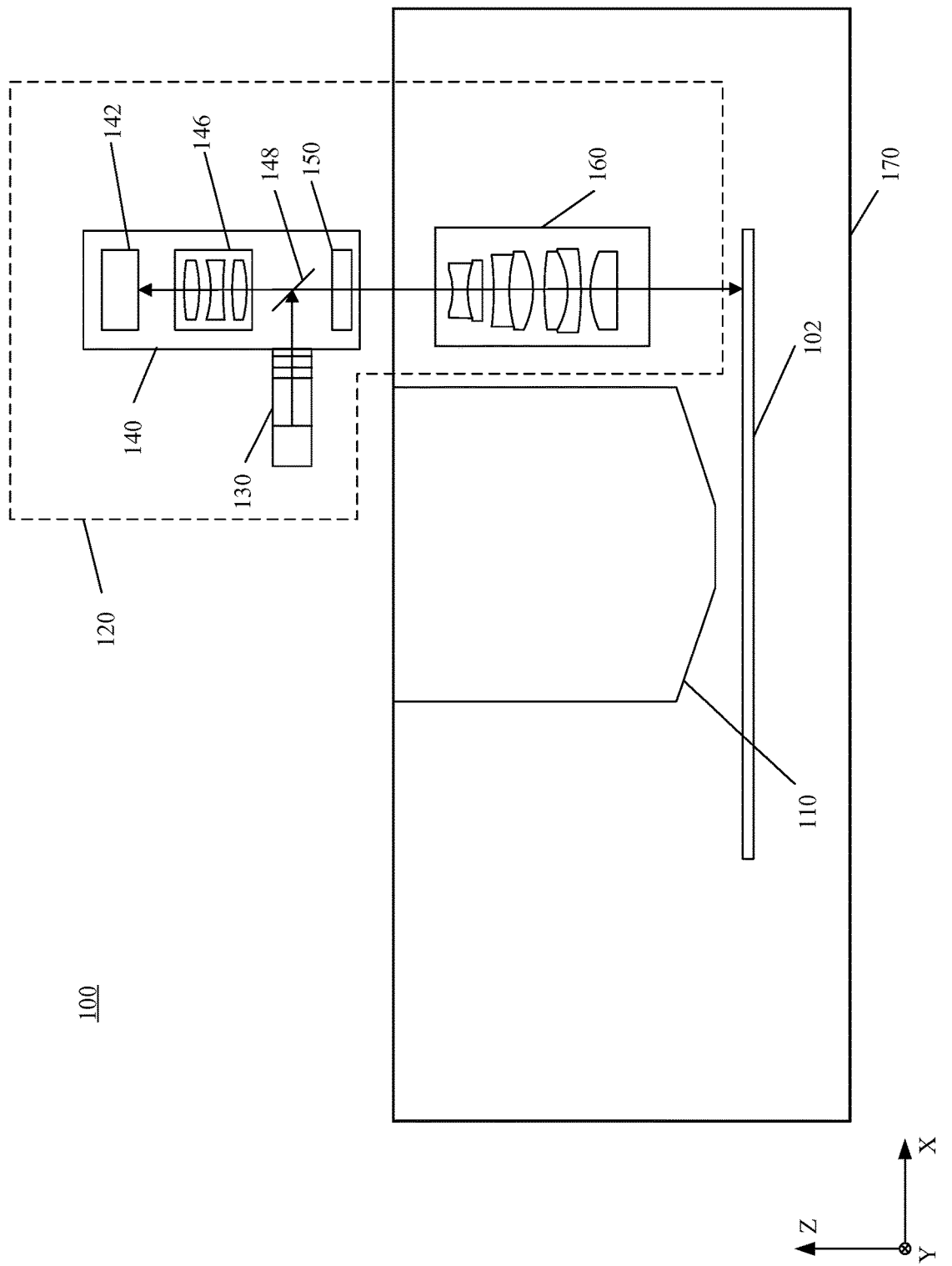
FIG. 1 is a schematic diagram of an exemplary charged particle-beam inspection system with an exemplary optical imaging system consistent with some disclosed embodiments.

FIG. 1 is a schematic diagram of an exemplary charged particle beam inspection system 100 with an exemplary optical imaging system 120 consistent with some disclosed embodiments. Charged particle beam inspection system 100 includes a charged particle beam column 110 for irradiating a charged particle beam (e.g., electron beam) on an inspected sample 102, and optical imaging system 120 for obtaining an image of sample 102. Optical imaging system 120 includes an illumination module 130, a detection module 140, and an objective lens 160. Illumination module 130 is configured to project a light beam to sample 102. Objective lens 160 is configured to conjugate a light beam reflected from sample 102. Detection module 140 includes a detector 142, a tube lens 146, a beam splitter 148, and a vacuum window 150. Detection module 140 is configured to detect an image of sample 102 based on the light beam reflected from sample 102. Charged particle beam column 110, objective lens 160, and sample 102 are disposed in an inspection chamber 170.

When illumination module 130 emits a light beam along an X-direction parallel to a surface of sample 102, part of the light beam is reflected by beam splitter 148 downwards along a Z-direction perpendicular to the surface of sample 102. The light beam is conjugated by objective lens 160 onto a surface of sample 102. At the sample surface, the light beam is reflected by sample 102. The reflected light beam is conjugated by objective lens 160 towards detection module 140 to form an image of sample 202. In detection module 140, the light beam passes through vacuum window 150 and beam splitter 148. Tube lens 146 magnifies the image of sample 102 formed by the light beam. The light beam then transmits to detector 142, which detects the image of sample 102.

Illumination module 130 may include an illumination source that emits the light beam. The illumination source may be a white light source which has a wide wavelength range. However, such a wide wavelength range of the light source will incur chromatic aberration easily. Therefore, in some exemplary embodiment of the present disclosure, the illumination source is a narrow-band light source that emits a light beam having a narrow wavelength distribution in the range of, for example, 495 nm to 572 nm. For example, the narrow-band light source can be a light emitting diode (LED). The narrow-band light source can effectively reduce or even eliminate the chromatic aberration. Consequently, it is desirable for objective lens 160 to be suitable for the narrow-band light beam.

During operation of charged particle beam inspection system 100, inspection chamber 170 is evacuated to place sample 102, charged particle beam column 110, and objective lens 160 under vacuum conditions. Therefore, it is desirable to configure objective lens 160 to be suitable for operation under vacuum conditions.

In addition, charged particle beam column 110 may include electronic components that are applied with high voltages (e.g., 30 kV) in order to incur electric breakdown in order to generate the charged particle beam. In order to prevent the negative effect of the high voltages on objective lens 160, objective lens 160 is usually arranged in a relatively large distance from sample 102. Therefore, it is desirable for objective lens 160 to have a long working distance and large field of view (FOV).

Figure 2:
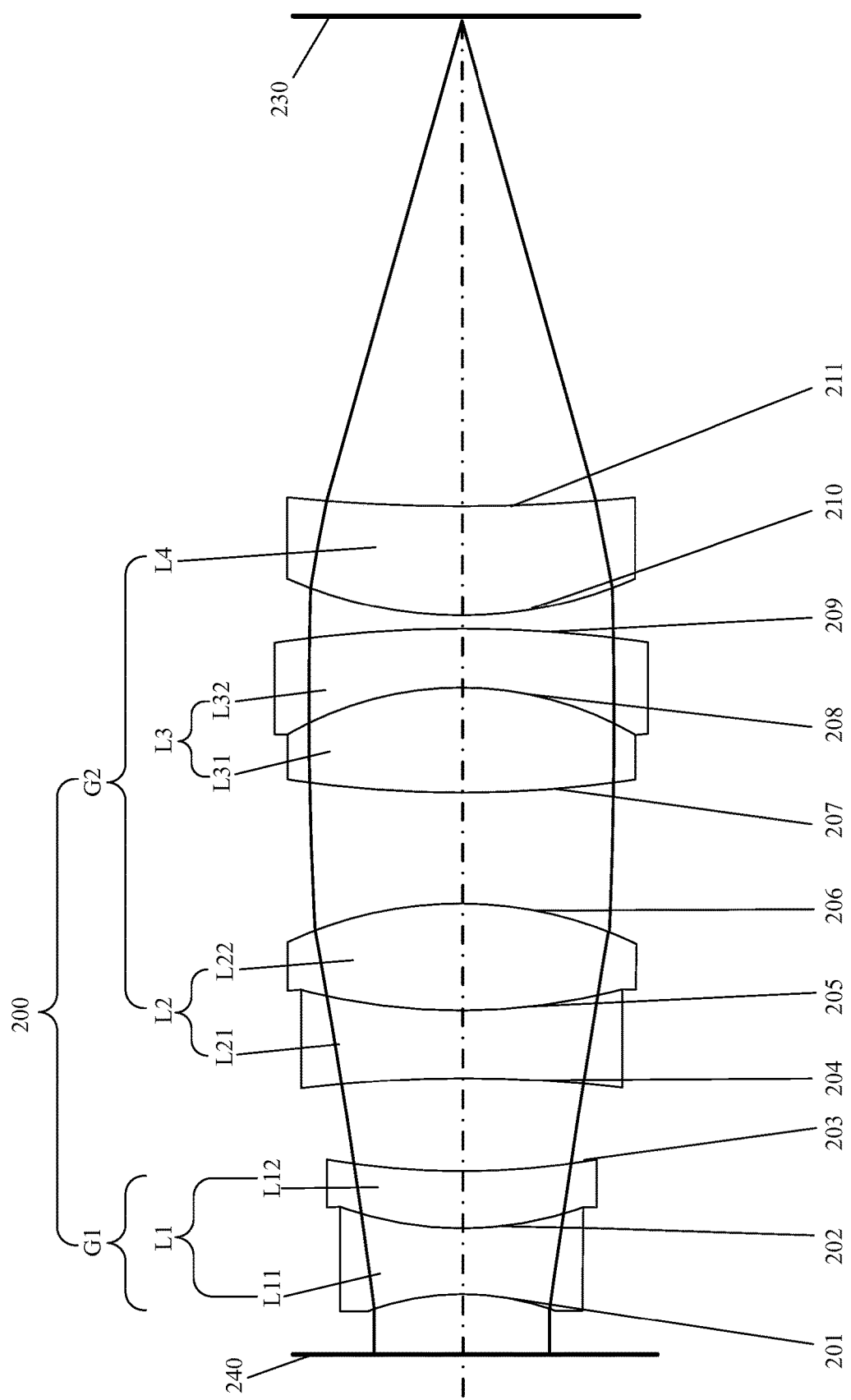
FIG. 2 is a schematic diagram of a sectional view of an exemplary objective lens 200, consistent with some disclosed embodiments.

FIG. 2 is a schematic diagram of a sectional view of an exemplary objective lens 200, consistent with some disclosed embodiments. Objective lens 200 can be used as objective lens 160 in optical imaging system 120 in charged particle beam inspection system 100 of FIG. 1. Objective lens 200 receives light from an object 230 (e.g., sample 102) and forms an image 240 of object 230. Hereinafter, the side where object 230 is disposed is referred to as an "object side," and the side where image 240 is formed is referred to as an "image side."

As illustrated in FIG. 2, objective lens 200 includes a first lens group G1 and a second lens group G2 sequentially arranged from the image side to the object side. First lens group G1 of the example of FIG. 2 provides negative refractive power and consists of a first lens unit L1. The effective focal length (EFL) of first lens group G1 ranges from −51 mm to −35 mm. Second lens group G2 provides positive refractive power and includes a second lens unit L2, a third lens unit L3, and a singlet lens element L4 sequentially arranged from the image side to the object side. The EFL of second lens group G2 ranges from 26 mm to 30 mm. The total EFL of objective lens 200 ranges from 22 mm to 27 mm.

First lens unit L1 is a doublet cemented lens that provides negative refractive power. First lens unit L1 consists of a first lens element L11 and a second lens element L12 sequentially arranged from the image side to the object side and are joined together. First lens L11 is a biconcave lens having a concave image surface 201 that faces image 240. Second lens L12 is a meniscus lens having a convex image surface 202 that faces image 240 and a concave object surface 203 that faces object 230. Surfaces 201, 202, and 203 provide negative, positive, and negative refractive powers, respectively. The EFL of first lens unit L1 ranges from −51 mm to −35 mm.

Second lens unit L2 is a doublet cemented lens that provides positive refractive power. Second lens unit L2 includes a third lens element L21 and a fourth lens element L22 sequentially arranged from the image side to the object side and are joined together. Third lens element L21 is a biconcave lens having a concave image surface 204 that faces image 240. Fourth lens element L22 is a biconvex lens having a convex image surface 205 that faces image 240 and a convex object surface 206 that faces object 230. Surfaces 204, 205, and 206 provide positive, negative, and positive refractive powers, respectively. The EFL of second lens unit L2 ranges from 74 mm to 369 mm.

Third lens unit L3 is a doublet cemented lens that provides positive refractive power. Third lens unit L3 includes a fifth lens element L31 and a sixth lens element L32 sequentially arranged from the image side to the object side and are joined together. Fifth lens element L31 is a biconvex lens having a convex image surface 207 that faces image 240 and a convex image surface 208 that faces object 230. Sixth lens element L32 is a meniscus lens having a convex object surface 209 that faces object 230. Surfaces 207, 208, and 209 provide positive, negative, and positive refractive powers, respectively. The EFL fL3 of third lens unit L3 ranges from 86 mm to 185 mm.

Singlet lens element L4 is a meniscus lens that provides positive refractive power. Singlet lens element L4 has a convex image surface 210 and a concave object surface 211. Both surfaces 210 and 211 provide positive refractive powers. The EFL fL4 of singlet lens element L4 ranges from 49 mm to 66 mm.

When objective lens 200 is used in combination with a tube lens (e.g., tube lens 146) with having an EFL of 200 mm, objective lens 200 can provide magnification ranges from 7.4× to 9.1×. The magnification of objective lens 200 can be further extended to a range from 9.1× to 12.1× by scaling the whole objective lens set. Objective lens 200 can be infinity corrected, and can have a working distance (WD) ranging from 35 mm to 40 mm, while keeping its parfocal length unchanged at 95 mm. Objective lens 200 can achieve a field of view (FOV) of at least 2.4 mm.

Table 1 summaries optical parameters of objective lens 200, according to an exemplary embodiment.

| Surface No. | Radius of curvature R (mm) | Surface space (mm) | Refractive index nd | Abbe's number Vd | Lens No. |
|---|---|---|---|---|---|
| 201 | −19.284 | 4.800 | 1.689 | 31.185 | L11 |
| 202 | 25.845 | 5.000 | 1.923 | 18.895 | L12 |
| 203 | 503.910 | 6.302 | | | |
| 204 | −75.000 | 5.000 | 1.854 | 40.599 | L21 |
| 205 | 47.877 | 8.000 | 1.713 | 53.939 | L22 |
| 206 | −29.419 | 8.139 | | | |
| 207 | 79.625 | 8.000 | 1.594 | 67.327 | L31 |
| 208 | −24.927 | 4.300 | 1.755 | 27.546 | L32 |
| 209 | −98.282 | 1.000 | | | |
| 210 | 32.856 | 8.690 | 1.729 | 54.669 | L4 |
| 211 | 212.344 | | | | |

In objective lens 200 of the exemplary embodiment described in Table 1, surfaces 201-211 provide negative, positive, negative, positive, negative, positive, positive, negative, positive, positive, positive refractive powers, respectively. The EFL of first lens group G1 and first lens unit L1 is 35.794 mm. The EFL of second lens group G2 is 26.949 mm. The EFL of second lens unit L2 is 81.474 mm. The EFL of third lens unit L3 is 121.079 mm. The EFL of singlet lens element LA is 51.385 mm. The total EFL of objective lens 200 of Table 1 is 24.188 mm and the numerical aperture (NA) is 0.26. The WD is 35.769 mm. The parfocal length is 95 mm.

Figure 3:
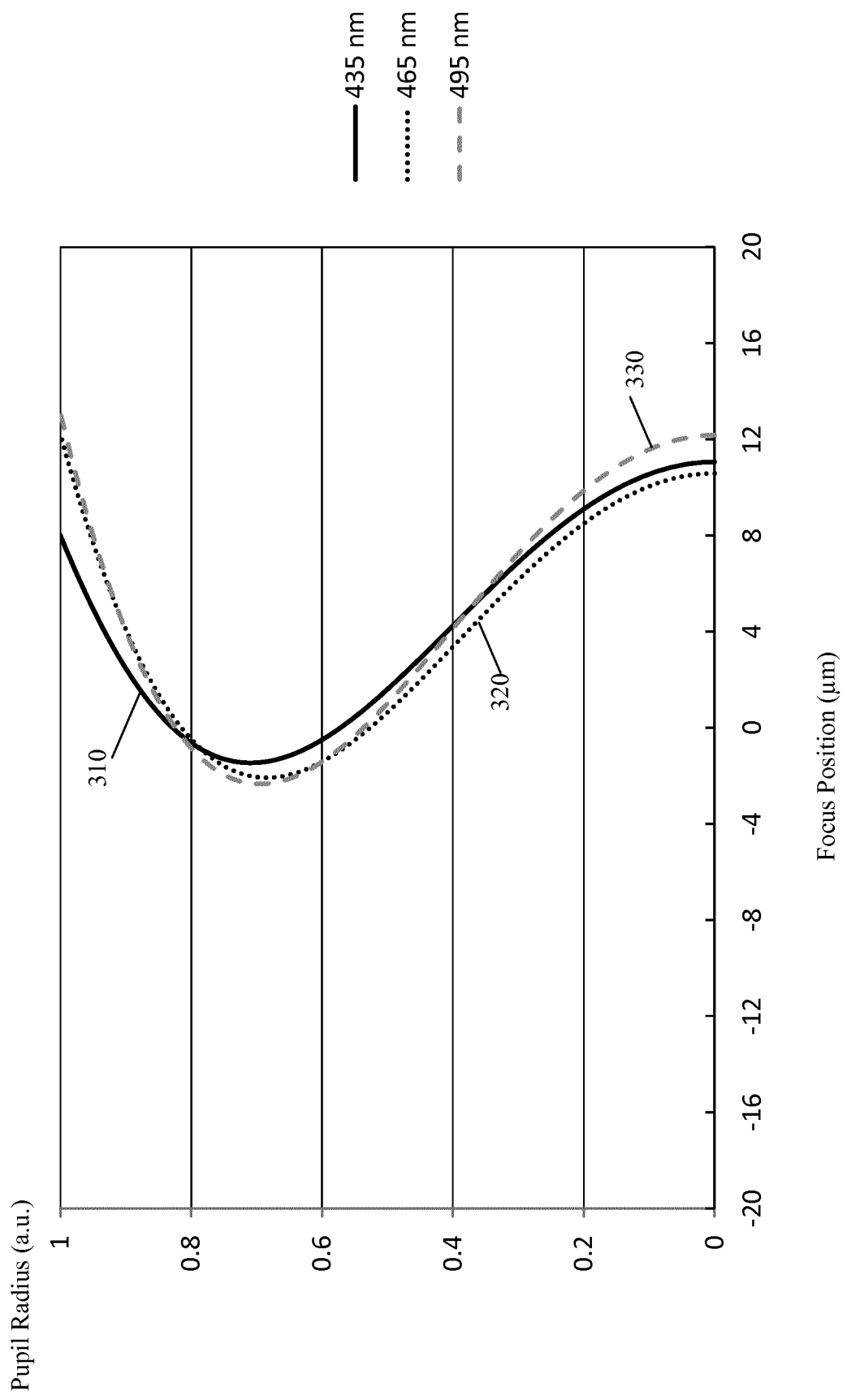
FIG. 3 is a graph showing longitudinal aberration of an objection lens in an exemplary embodiment.

FIG. 3 is a graph showing longitudinal aberration of objective lens 200 in the exemplary embodiment of Table 1. In the graph, the horizontal axis represents a focus position, and the vertical axis represents a pupil radius. The solid curve 310 represents the longitudinal aberration for a light having a wavelength of 435 nm. The dotted curve 320 represents the longitudinal aberration for a light having a wavelength of 465 nm. The dashed curve 330 represents the longitudinal aberration for a light having a wavelength of 495 nm. According to FIG. 3, the spherical aberration of objective lens 200 of Table 1 is well corrected at 0.55 pupil and 0.82 pupil. At 0 and 1.0 pupils, the residual aberration is about 10 μm.

Figure 4:
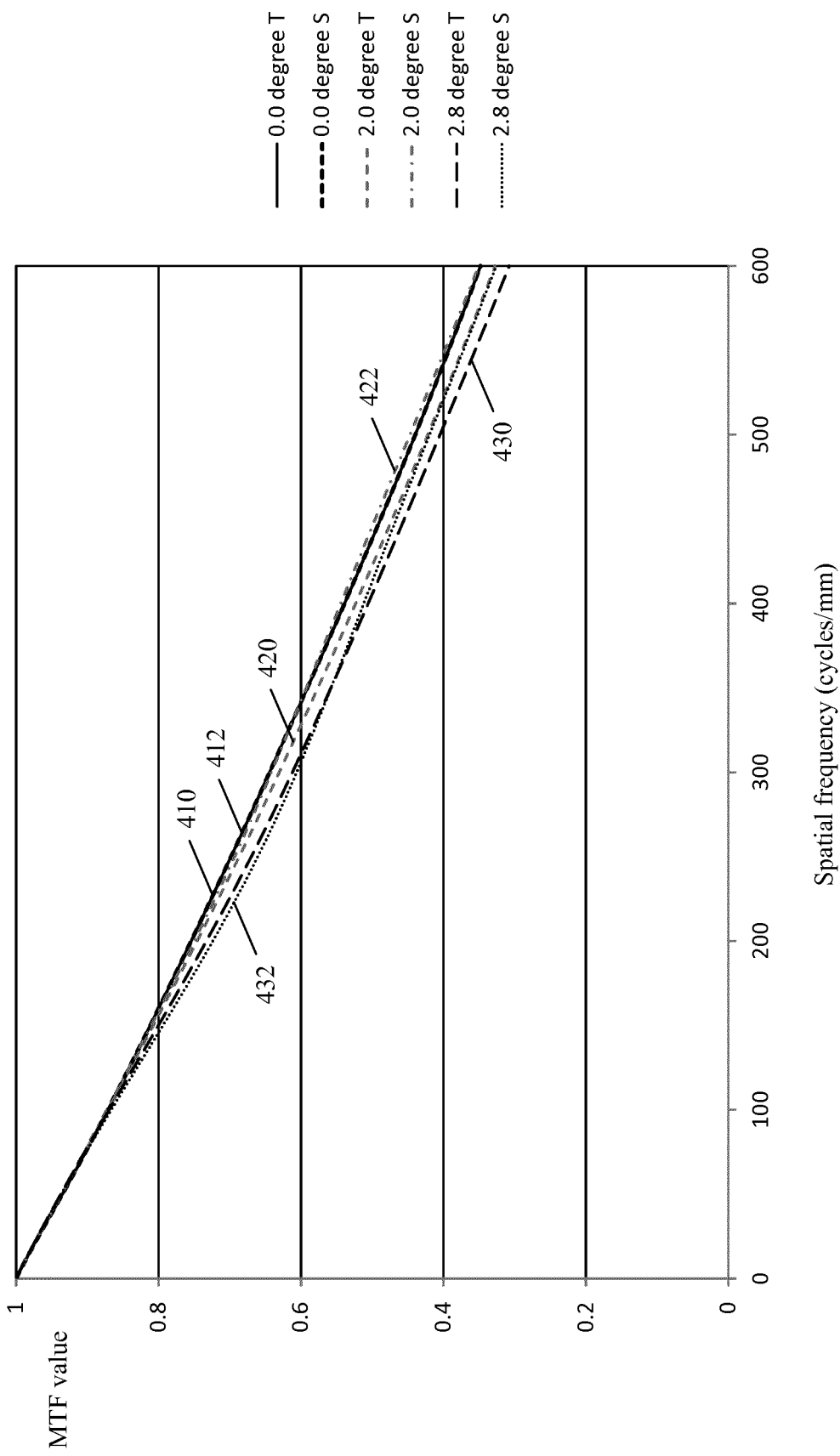
FIG. 4 is a graph showing Fast Fourier transform (FFT) modulation transfer function (MTF) of an objection lens in an exemplary embodiment.

FIG. 4 is a graph showing Fast Fourier transform (FFT) modulation transfer function (MTF) of objective lens 200 in the exemplary embodiment of Table 1. In the graph, the horizontal axis represents spatial frequency, and the vertical axis represents a MTF value. Curve 410 represents the tangential (T) MTF for the 0.0 degree field point; curve 412 represents the sagittal (S) MTF for the 0.0 degree field point; curve 420 represents the tangential (T) MTF for the 2.0 degree field point; curve 422 represents the sagittal (S) MTF for the 2.0 degree field point; curve 430 represents the tangential (T) MTF for the 2.8 degree field point; and curve 432 represents the sagittal (S) MTF for the 2.8 degree field point. The 2.8 degree field point corresponds to the 1.2 mm field point. According to FIG. 4, the MTF of objective lens 200 of Table 1 has been well corrected to coincide with a diffraction limited MTF. At the spatial frequency of 600 cycles per mm, the MTF value for the three field points are almost kept as high as 0.3.

According to the above disclosed embodiments, objective lens 200 includes, sequentially from the image side to the object side, first lens group G1 having negative refractive power and second lens group G2 having positive refractive power. An EFL of first lens group G1 ranges from −51 mm to −35 mm, and an EFL of second lens group G2 ranges from 26 mm to 30 mm. Objective lens 200 has a long working distance and large field of view, and thus is suitable for use in optical imaging system 120 in charged particle beam inspection system 100.

The embodiments may further be described using the following clauses:

1. An objective lens for forming an image of an object, comprising, sequentially from an image side to an object side:
   a first lens group having negative refractive power; and
   a second lens group having positive refractive power.
2. The objective lens of clause 1, wherein an effective focus length (EFL) of the first lens group ranges from −51 mm to −35 mm, and an EFL of the second lens group ranges from 26 mm to 30 mm.
3. The objective lens of any one of clauses 1 and 2, wherein the first lens group comprises a first doublet cemented lens consisting of, sequentially from the image side to the object side, a first lens and a second lens that provide negative refractive power in total,
   the first doublet cemented lens has first through third surfaces arranged sequentially from the image side to the object side, and
   the first through third surfaces provide negative, positive, and negative refractive powers, respectively.
4. The objective lens of any one of clauses 1 through 3, wherein the second lens group comprises, sequentially from the image side to the object side, a second doublet cemented lens L2, a third doublet cemented lens L3, and a singlet lens L4.
5. The objective lens of clause 4, wherein the second doublet cemented lens consists of, sequentially from the image side to the object side, a third lens L21 and a fourth lens L22 that provide positive refractive power in total,
   the second doublet cemented lens L2 has fourth through sixth surfaces arranged sequentially from the image side to the object side,
   the fourth through sixth surfaces provide positive, negative, and positive refractive powers, respectively.
6. The objective lens of clause 5, wherein an EFL of the second doublet cemented lens ranges from 74 mm to 369 mm.
7. The objective lens of any one of clauses 4 through 6, wherein the third doublet cemented lens L3 comprises, sequentially from the image side to the object side, a fifth lens L31 and a sixth lens L32 that provide positive refractive power in total,
   the third doublet cemented lens L3 has seventh through ninth surfaces arranged sequentially from the image side to the object side,
   the seventh through ninth surfaces provide positive, negative, and positive refractive powers, respectively.
8. The objective lens of clause 7, wherein an EFL of the third doublet cemented lens ranges from 86 mm to 185 mm.
9. The objective lens of any one of clauses 4 through 8, wherein the singlet lens L4 provides positive refractive power,
   the singlet lens L4 has tenth and eleventh surfaces arranged sequentially from the image side to the object side,
   both of the tenth and eleventh surfaces provide positive refractive powers.
10. The objective lens of clause 9, wherein an EFL of the singlet lens ranges from 49 mm to 66 mm.
11. The objective lens of any one of clauses 1 through 10, wherein a total EFL of the objective lens ranges from 22 mm to 27 mm.
12. The objective lens of any one of clauses 1 through 11, wherein when the objective lens is used in combination with a tube lens having an EFL of 200 mm, magnification of the objective lens ranges from 7.4× to 9.1×.
13. The objective lens of any one of clauses 1 through 11, wherein when the objective lens is used in combination with a tube lens having an EFL of 200 mm, magnification of the objective lens ranges from 9.0× to 12.1×.
14. The objective lens of any one of clauses 1 through 13, wherein a working distance of the objective lens ranges from 35 mm to 40 mm.
15. The objective lens of any one of clauses 1 through 14, wherein a parfocal length of the objective lens is about 95 mm.
16. The objective lens of any one of clauses 1 through 15, wherein a field of view of the objective lens is about 2.4 mm.
17. An optical imaging system used in a charged particle beam inspection system, comprising:
   an illumination module configured to project a first light beam to an object;
   an objective lens configured to receive a second light beam reflected from the object and form an image of the object; and
   a detection module configured to detect the image of the sample,
   wherein the objective lens comprises, sequentially from an image side to an object side:
   a first lens group having negative refractive power; and
   a second lens group having positive refractive power.
18. The system of clause 17, wherein the illumination module includes a narrow-band light source having a wavelength range from 495 nm to 572 nm.
19. The system of any one of clauses 17 and 18, wherein an effective focus length (EFL) of the first lens group ranges from −51 mm to −35 mm, and an EFL of the second lens group ranges from 26 mm to 30 mm.
20. The system of any one of clauses 17 through 19, wherein the first lens group comprises a first doublet cemented lens consisting of, sequentially from the image side to the object side, a first lens and a second lens that provide negative refractive power in total, the first doublet cemented lens has first through third surfaces arranged sequentially from the image side to the object side, and the first through third surfaces provide negative, positive, and negative refractive powers, respectively.

21. The system of any one of clauses 17 through 20, wherein the second lens group comprises, sequentially from the image side to the object side, a second doublet cemented lens L2, a third doublet cemented lens L3, and a singlet lens L4.

22. The system of clause 21, wherein the second doublet cemented lens consists of, sequentially from the image side to the object side, a third lens L21 and a fourth lens L22 that provide positive refractive power in total, the second doublet cemented lens L2 has fourth through sixth surfaces arranged sequentially from the image side to the object side, the fourth through sixth surfaces provide positive, negative, and positive refractive powers, respectively.

23. The system of clause 22, wherein an EFL of the second doublet cemented lens ranges from 74 mm to 369 mm.

24. The system of any one of clauses 21 through 23, wherein the third doublet cemented lens L3 comprises, sequentially from the image side to the object side, a fifth lens L31 and a sixth lens L32 that provide positive refractive power in total, the third doublet cemented lens L3 has seventh through ninth surfaces arranged sequentially from the image side to the object side, the seventh through ninth surfaces provide positive, negative, and positive refractive powers, respectively.

25. The system of clause 24, wherein an EFL of the third doublet cemented lens ranges from 86 mm to 185 mm.

26. The system of any one of clauses 21 through 25, wherein the singlet lens LA provides positive refractive power, the singlet lens L4 has tenth and eleventh surfaces arranged sequentially from the image side to the object side, both of the tenth and eleventh surfaces provide positive refractive powers.

27. The system of clause 26, wherein an EFL of the singlet lens ranges from 49 mm to 66 mm.

28. The system of any one of clauses 17 through 27, wherein a total EFL of the objective lens ranges from 22 mm to 27 mm.

29. The system of any one of clauses 17 through 28, wherein when the objective lens is used in combination with a tube lens having an EFL of 200 mm, magnification of the objective lens ranges from 7.4× to 9.1×.

30. The system of any one of clauses 17 through 28, wherein when the objective lens is used in combination with a tube lens having an EFL of 200 mm, magnification of the objective lens ranges from 9.0× to 12.1×.

31. The system of any one of clauses 17 through 30, wherein a working distance of the objective lens ranges from 35 mm to 40 mm.

32. The system of any one of clauses 17 through 31, wherein a parfocal length of the objective lens is about 95 mm.

33. The system of any one of clauses 17 through 31, wherein a field of view of the objective lens is about 2.4 mm.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An optical imaging system used in a charged particle beam inspection comprising:
    an illumination module configured to project a first light beam to an object, wherein the illumination module includes a narrow-band light source;
    an objective lens configured to receive a second light beam reflected from the object and form an image of the object and configured to be used under vacuum conditions; and
    a detection module configured to detect the image of the sample,
    wherein the objective lens comprises, sequentially from an image side to an object side:
        a first lens group having negative refractive power; and
        a second lens group having positive refractive power.

2. The optical imaging system of claim 1, wherein an effective focus length (EFL) of the first lens group ranges from −51 mm to −35 mm, and an EFL of the second lens group ranges from 26 mm to 30 mm.

3. The optical imaging system of claim 1, wherein the first lens group comprises a first doublet cemented lens consisting of, sequentially from the image side to the object side, a first lens and a second lens that provide negative refractive power in total,
    wherein the first doublet cemented lens has first through third surfaces arranged sequentially from the image side to the object side, and
    wherein the first through third surfaces provide negative, positive, and negative refractive powers, respectively.

4. The optical imaging system of claim 1, wherein the second lens group comprises, sequentially from the image side to the object side, a second doublet cemented lens L2, a third doublet cemented lens L3, and a singlet lens L4.

5. The optical imaging system of claim 4, wherein the second doublet cemented lens consists of, sequentially from the image side to the object side, a third lens L21 and a fourth lens L22 that provide positive refractive power in total,
    wherein the second doublet cemented lens L2 has fourth through sixth surfaces arranged sequentially from the image side to the object side, and
    wherein the fourth through sixth surfaces provide positive, negative, and positive refractive powers, respectively.

6. The optical imaging system of claim 5, wherein an EFL of the second doublet cemented lens ranges from 74 mm to 369 mm.

7. The optical imaging system of claim 4, wherein the third doublet cemented lens L3 comprises, sequentially from the image side to the object side, a fifth lens L31 and a sixth lens L32 that provide positive refractive power in total,
    wherein the third doublet cemented lens L3 has seventh through ninth surfaces arranged sequentially from the image side to the object side, and
    wherein the seventh through ninth surfaces provide positive, negative, and positive refractive powers, respectively.

8. The optical imaging system of claim 7, wherein an EFL of the third doublet cemented lens ranges from 86 mm to 185 mm.

9. The optical imaging system of claim 4, wherein the singlet lens L4 provides positive refractive power, wherein the singlet lens L4 has tenth and eleventh surfaces arranged sequentially from the image side to the object side, and wherein both of the tenth and eleventh surfaces provide positive refractive powers.

10. The optical imaging system of claim 9, wherein an EFL of the singlet lens ranges from 49 mm to 66 mm.

11. The optical imaging system of claim 1, wherein a total EFL of the objective lens ranges from 22 mm to 27 mm.

12. The optical imaging system of claim 1, wherein when the objective lens is used in combination with a tube lens having an EFL of 200 mm, and wherein magnification of the objective lens ranges from 7.4× to 9.1×.

13. The optical imaging system of claim 1, wherein when the objective lens is used in combination with a tube lens having an EFL of 200 mm, and wherein magnification of the objective lens ranges from 9.0× to 12.1×.

14. The optical imaging system of claim 1, wherein a parfocal length of the objective lens is about 95 mm.

15. The optical imaging system of claim 1, wherein the narrow-band light source has a wavelength range from 495 nm to 572 nm.

\* \* \* \* \*